(12) United States Patent
Martinez et al.

(10) Patent No.: US 7,098,700 B2
(45) Date of Patent: Aug. 29, 2006

(54) LOW POWER OUTPUT DRIVER

(75) Inventors: Nanci Martinez, Los Angeles, CA (US); Seth L. Everton, Torrance, CA (US); Erick M. Hirata, Torrance, CA (US); Lloyd F. Linder, Agoura Hills, CA (US)

(73) Assignee: TelASIC Communications, Inc., El Segundo, CA (US)

( * ) Notice: Subject to any disclaimer, the term of this patent is extended or adjusted under 35 U.S.C. 154(b) by 0 days.

(21) Appl. No.: 10/886,850

(22) Filed: Jul. 8, 2004

(65) Prior Publication Data

US 2005/0127955 A1   Jun. 16, 2005

Related U.S. Application Data

(60) Provisional application No. 60/529,335, filed on Dec. 12, 2003.

(51) Int. Cl.
*H03B 1/00* (2006.01)
*H03K 3/00* (2006.01)

(52) U.S. Cl. .......................................... 327/108; 327/53

(58) Field of Classification Search ............ 327/52–53, 327/65–66, 89, 108, 478, 483, 490; 330/252, 330/257, 277, 288

See application file for complete search history.

(56) References Cited

U.S. PATENT DOCUMENTS

| | | | | |
|---|---|---|---|---|
| 5,512,857 | A * | 4/1996 | Koskowich | ................. 330/252 |
| 6,104,244 | A * | 8/2000 | Gilbert | ....................... 330/267 |
| 6,130,575 | A * | 10/2000 | Nelson et al. | .............. 327/540 |
| 6,791,377 | B1 * | 9/2004 | Ilchmann et al. | ........... 327/108 |
| 6,853,510 | B1 * | 2/2005 | Chaiken et al. | ................ 360/67 |

* cited by examiner

*Primary Examiner*—My-Trang Nu Ton
(74) *Attorney, Agent, or Firm*—Morrison & Foerster LLP

(57) ABSTRACT

An output driver. The novel output driver includes a first circuit for receiving an input signal and in accordance therewith generating an output signal at an output node, a second circuit for applying a variable current to the output node, and a third circuit for controlling the magnitude of the variable current in accordance with the input signal. In an illustrative embodiment, the third circuit is adapted to generate a controlling current in accordance with the input signal, and the second circuit includes a current mirror adapted to receive the controlling current and output a scaled version of the controlling current to the output node.

29 Claims, 4 Drawing Sheets

LOW POWER OUTPUT DRIVER

CROSS-REFERENCE TO RELATED APPLICATIONS

This application claims the benefit of U.S. Provisional Application No. 60/529,335 filed Dec. 12, 2003, the disclosure of which is hereby incorporated by reference.

BACKGROUND OF THE INVENTION

1. Field of the Invention

The present invention relates to electronics. More specifically, the present invention relates to output drivers for digital circuits.

2. Description of the Related Art

Electronic circuits typically include several output drivers used to pass signals from one chip to another, or from one circuit board to another. An example of this is an M-bit analog to digital converter (ADC) driving an external circuit. In this case, a differential output driver is required for each bit (for a total of M differential output drivers), as well as additional output drivers for the saturation and "data valid" bits. Another example is a multi-channel deserializer or switch matrix where the number of differential output drivers could be greater than 100.

The objective of a digital output driver is to swing the output voltage from one defined level to another as rapidly as possible. Due to the capacitive load on the output driver, in order to make a fast transition between logic states, the output driver must sink or source a large current into the output transmission line in order to provide an output signal having logic high and logic low signals within their specified voltage ranges. The rising transition time (to go from logic low to logic high) of a typical output driver is relatively short. The falling transition time (to go from logic high to logic low), however, is usually much longer because the rate at which the load capacitance can discharge is set by the current sink. The larger the current sink is, the faster the trailing edge will go down. This is, of course, a tradeoff with power dissipation. The larger the current sink is, the more power the circuit will dissipate.

Digital output drivers must therefore provide adequate current sourcing and sinking capability in order to drive capacitive and resistive loads at the required speed. If differential outputs are required, then two current sources are needed for each driver. For circuits having several output drivers, considerable power is dissipated by the need to have several current sources providing drive and sink currents for the output drivers.

Hence, there is a need in the art for an improved output driver offering lower power consumption than prior art output drivers, which is operable at high speeds.

SUMMARY OF THE INVENTION

The need in the art is addressed by the output driver of the present invention. The novel output driver includes a first circuit for receiving an input signal and in accordance therewith generating an output signal at an output node, a second circuit for applying a variable current to the output node, and a third circuit for controlling the magnitude of the variable current in accordance with the input signal. In an illustrative embodiment, the third circuit is adapted to generate a controlling current in accordance with the input signal, and the second circuit includes a current mirror adapted to receive the controlling current and output a scaled version of the controlling current to the output node.

BRIEF DESCRIPTION OF THE DRAWINGS

FIG. 1b is a graph of an example input waveform $V_{IN}$ and a corresponding output waveform $V_{OUT}$ for the conventional output driver of FIG. 1a.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1A:
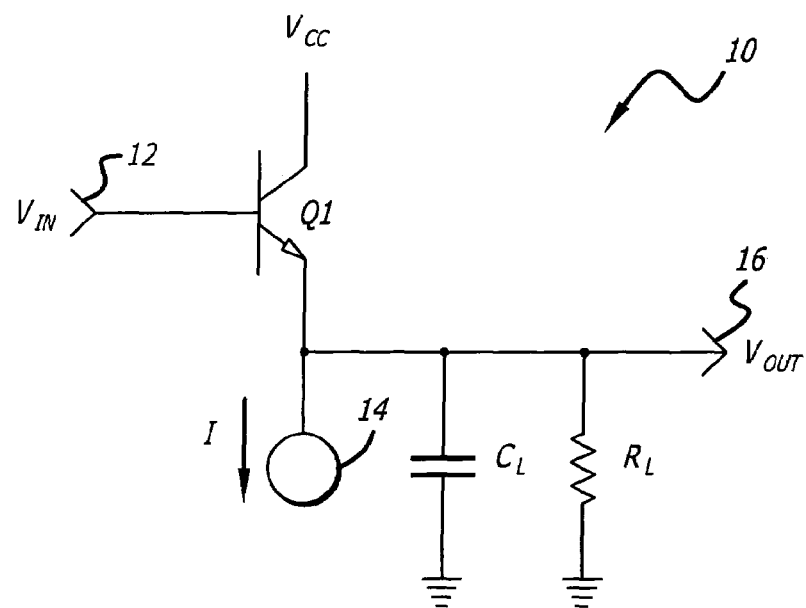
FIG. 1a is a simplified schematic of a conventional single-ended output driver.

FIG. 1a is a simplified schematic of a conventional single-ended output driver 10. The output driver 10 includes a transistor Q1 having a base adapted to receive an input signal $V_{IN}$ from an input terminal 12, a collector coupled to a voltage supply $V_{CC}$, and an emitter coupled to a current source 14 of value I and to an output terminal 16, which provides an output signal $V_{OUT}$. The emitter of Q1 is also coupled to a load capacitance $C_L$ and load resistance $R_L$.

Figure 1B:
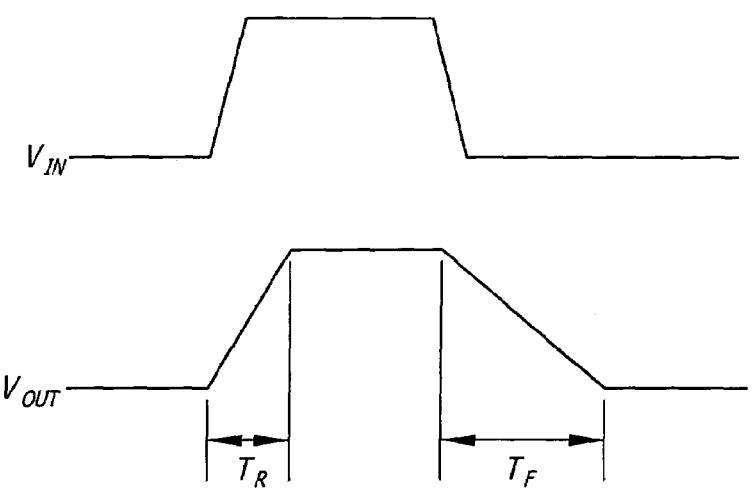

The objectives of this circuit 10 are to swing the output voltage $V_{OUT}$ from one defined level to another as rapidly as possible. FIG. 1b is a graph of an example input waveform $V_{IN}$ and a corresponding output waveform $V_{OUT}$ for the output driver 10 of FIG. 1a. As can be seen in FIG. 1b, when the input $V_{IN}$ goes from a low level to a high level, then the output $V_{OUT}$ goes from a low level to a high level relatively rapidly (i.e. the circuit 10 has a fast rising transition time $T_R$). This is because the current to charge the load capacitance $C_L$ is supplied by Q1 and limited mostly by the base current drive.

On the other hand, when the input $V_{IN}$ goes negative, from a high level to a low level, then the output $V_{OUT}$ follows more slowly. This is because the rate at which $C_L$ can discharge is set by the current sink, I. The larger the current sink I is, the faster the trailing edge will go down. The larger I is, however, the more power the circuit 10 will dissipate.

There is therefore a minimum value for the current source/sink required in order for the circuit to operate at the desired speed. Setting the value for the current I must satisfy two criteria. First, it must provide the desired output voltage swing between logic low and logic high. For example, assume the desired output swing is 0.4 V. Therefore, $V_{OUT}=IR_L$ or $I=V_{OUT}/R_L$. Next, I must satisfy the slew rate requirements as depicted by $I=C_L dV_{OUT}/dt$. For this example, let $C_L=1.0$ pF, $V_{OUT}=0.4$ V, and the desired maximum transition time $\Delta T=0.1$ nanoseconds. Setting these two equations for I equal to each other results in: $V_{OUT}/R_L=C_L dV_{OUT}/dt$, or $0.4/R_L=10^{-12}$ $(0.4/10^{-10})$. Solving for $R_L$ gives: $R_L=0.4\times10^{-10}/0.4\times10^{-10}=100\Omega$. Then, substituting back into the first equation, gives the result $I=V_{OUT}/R_L=0.4/100=4$ mA.

FIG. 1a shows a single ended output driver. If a differential output was required, then two current sources would be needed, one for each output. The prior art has attempted to reduce power in a differential output driver by devising a circuit that utilizes only one current sink to drive $R_L$ and to discharge $C_L$ by switching it from one output to the other, as required (or steered) by the input signal.

Figure 2:
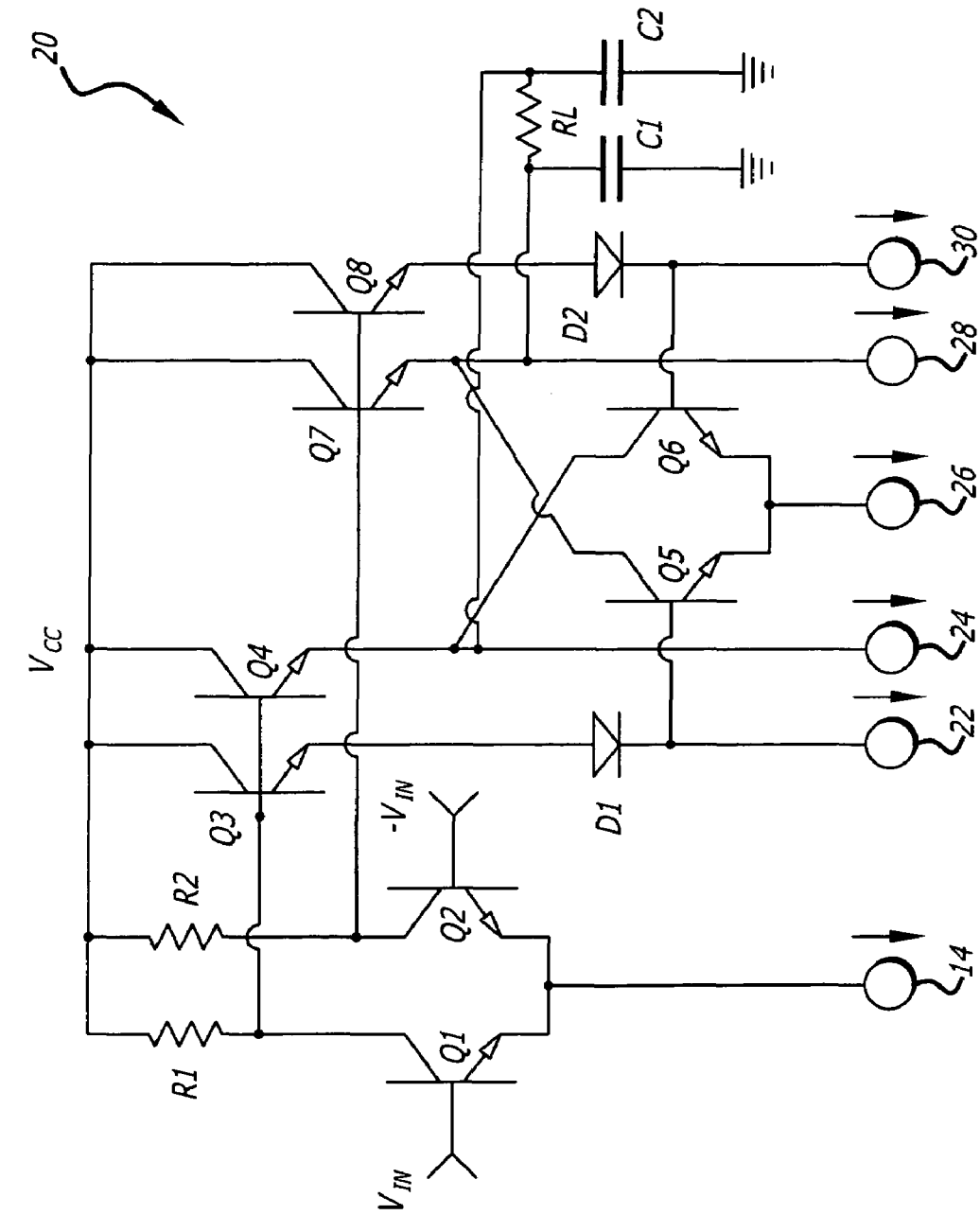
FIG. 2 is a simplified schematic of a conventional differential output driver.

FIG. 2 is a simplified schematic of a conventional differential output driver 20. The circuit 20 includes a differential pair Q1 and Q2, having emitters connected in common to a current source 14, bases coupled to differential input signals $V_{IN}$ and $-V_{IN}$, respectively, and collectors coupled to $V_{CC}$ through resistors R1 and R2, respectively. The collector of Q1 is also coupled to the bases of transistors Q3 and Q4, and the collector of Q2 is also coupled to the bases of transistors Q7 and Q8. The collectors of Q3, Q4, Q7 and Q8 are coupled to $V_{CC}$. The emitter of Q3 is connected to the anode of a diode D1, the cathode of which is connected to a current source 22 and to the base of a transistor Q5. The emitter of Q4 is connected to a current source 24 and to the collector of a transistor Q6. The emitter of Q7 is connected to a current source 28 and to the collector of Q5. The emitter of Q8 is connected to the anode of a diode D2, the cathode of which is connected to a current source 30 and to the base of Q6. The emitters of Q5 and Q6 are connected in common to a current source 26. The outputs of the driver 20, at the collectors of Q5 and Q6, are coupled to load capacitances C1 and C2, respectively, and a load resistance $R_L$ is connected between the collectors of Q5 and Q6.

As can be seen in FIG. 2, six current sinks are required in a conventional differential output driver 20. The current source 26 is the largest sink, because it provides the needed voltage drop across $R_L$. The current source 26 also discharges the load capacitance and is switched from one output to the other as steered by $V_{IN}$. If $V_{IN}$ is more positive than $-V_{IN}$, then Q1 is on and Q2 is off. Therefore, the emitter of Q7 is at $V_{CC}-0.8$ V. If, as an example, the resistance of R1 multiplied by the current in current source 22 was equal to 1 V, then the emitter of Q4 would be at $V_{CC}-1.8$ V. Q6 would be on because the base of Q6 is equal to $V_{CC}-0.8$ V−0.8 V, which equals 3.4 V if $V_{CC}=5$ V. Q5 would be off because the base of Q5 would be equal to $V_{CC}-1$ V−0.8 V−0.8 V=2.4 V. This is one volt more negative than the base of Q6.

Now, when $V_{IN}$ goes more negative than $-V_{IN}$, Q5 will turn on because its base voltage will be higher than the base voltage at Q6. When Q5 turns on, the current sink 26 will be routed to the emitter of Q7, allowing C1 to discharge rapidly through the current sink 26. In this way, the current sink 26 is shared between the two outputs as required to provide the sink current as the respective output is pulled low. In this prior art implementation, all six current sources are operational all the time and therefore they will all add to the power dissipated in the driver circuit. The present invention minimizes this power dissipation by implementing the current sources in a novel configuration, allowing them to be turned off or reduced in magnitude when not required.

Figure 3:
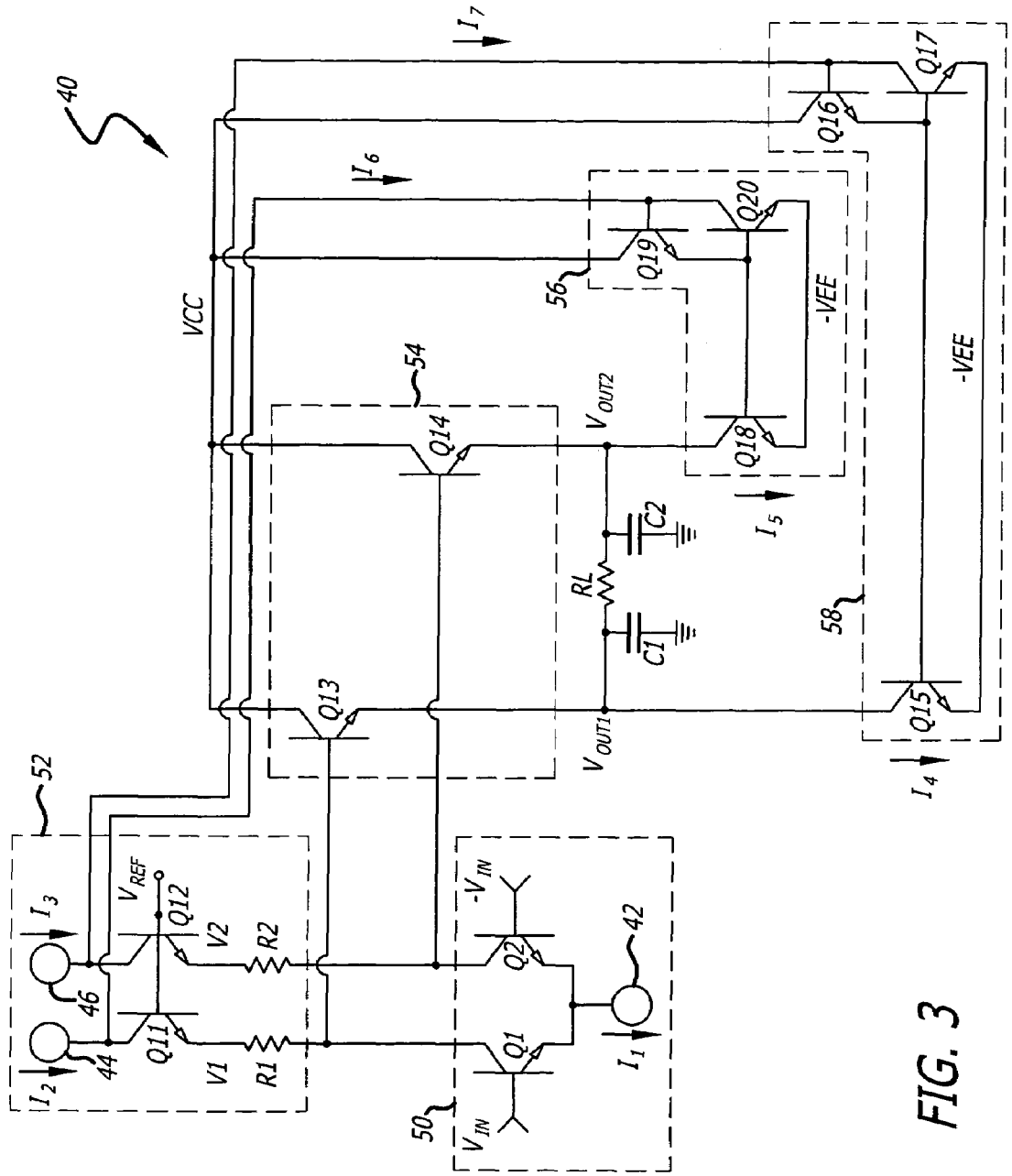
FIG. 3 is a simplified schematic of an illustrative embodiment of an output driver designed in accordance with the teachings of the present invention.

FIG. 3 is a simplified schematic of an illustrative embodiment of an output driver 40 designed in accordance with the teachings of the present invention. The embodiment shown is a differential implementation. The invention, however, is not limited thereto. It may be applied to a single-ended implementation without departing from the scope of the present teachings.

The novel output driver 40 includes an input circuit 50 comprising a differential pair Q1 and Q2, having emitters connected in common to a current source 42 of value $I_1$, and bases coupled to differential inputs $V_{IN}$ and $-V_{IN}$, respectively. The outputs of Q1 and Q2 are coupled to a current controlling circuit 52, including transistors Q11 and Q12, and to an output circuit 54, including transistors Q13 and Q14. The collector of Q1 is coupled to the base of Q13, and to the emitter of Q11 through a resistor R1. The collector of Q2 is coupled to the base of Q14, and to the emitter of Q12 through a resistor R2. The emitter of Q13 is connected to a first output node $V_{OUT1}$ and to a load capacitance C1, and the emitter of Q14 is connected to a second output node $V_{OUT2}$ and to a load capacitance C2. A load resistance $R_L$ is connected between $V_{OUT1}$ and $V_{OUT2}$.

The current controlling circuit 52 is adapted to generate variable currents $I_6$ and $I_7$, the values of which depend on the input signals. The current $I_6$ controls the current sink for the load capacitance C2, and the current $I_7$ controls the current sink for C1. When $V_{IN}$ becomes more negative than $-V_{IN}$, then C2 needs a large current sink in order to discharge rapidly. C1, on the other hand, does not need a large current sink. The circuit 52 therefore outputs a large $I_6$ and a small $I_7$. When $V_{IN}$ becomes more positive than $-V_{IN}$, then C1 needs the large current sink, and the circuit 52 outputs a large $I_7$ and a small $I_6$. In the illustrative embodiment, the current controlling circuit 52 includes transistors Q11 and Q12. The bases of Q11 and Q12 are connected to a reference voltage $V_{REF}$, and the collectors are connected to a current source 44 of value $I_2$ and a current source 46 of value $I_3$, respectively. The currents $I_2$ and $I_3$ are slightly larger than $I_1$, so $I_2=I_3=I_1+\Delta I$. (In this embodiment, $I_2$ is equal to $I_3$ for symmetry, but $I_2$ can differ from $I_3$ without departing from the scope of the present teachings.) The voltage at the emitter of Q11 is labeled V1, and the voltage at the emitter of Q12 is labeled V2. The collector of Q11 is also connected to a first current mirror 56, supplying the current mirror 56 with a current $I_6$. The collector of Q12 is also connected to a second current mirror 58, supplying the current mirror 58 with a current $I_7$.

The current mirror 58 includes transistors Q15, Q16, and Q17. The emitters of Q15 and Q17 are connected in common to a negative power Supply $-V_{EE}$, and the bases of Q15 and Q17 are connected in common to the emitter of Q16. The collector of Q15 is connected to $V_{OUT1}$, and the collector of Q16 is connected to $V_{CC}$. The collector of Q17 is connected to the base of Q16 and to the collector of Q12. The current $I_4$ at the collector of Q15 is controlled by the current $I_7$ at the collector of Q17.

The current mirror 56 includes transistors Q18, Q19, and Q20. The emitters of Q18 and Q20 are connected in common to $-V_{EE}$, and the bases of Q18 and Q20 are connected in common to the emitter of Q19. The collector of Q18 is connected to $V_{OUT2}$, and the collector of Q19 is connected to $V_{CC}$. The collector of Q20 is connected to the base of Q19 and to the collector of Q11. The current $I_5$ at the collector of Q18 is controlled by the current $I_6$ at the collector of Q20.

A description of the circuit's operation follows. Let $R_L$ equal the output load and C1 and C2 are load-related capacitances. If the circuit 40 is in a steady state where $V_{IN}$ is more positive than $-V_{IN}$, then Q1 is on and Q2 is off. $I_2$ is slightly larger than $I_1$, $I_2=I_1+\Delta I$, therefore $I_2$ splits and its $I_1$ component flows through Q1. The residual current, $\Delta I$, becomes $I_6$. Due to the nature of current mirrors, $I_5=NI_6$, where N is some number depending on the characteristics of the transistors (Q18, Q19, Q20) forming the current mirror. Let N=5, so $I_5$=5 $I_6$=5ΔI. Since Q2 is off, Q14 is conducting and its emitter voltage $V_{OUT2}$ is approximately equal to V2−0.8 V. The emitter of Q13 is at $V_{OUT1}$=V1−($I_1$R1)−0.8 V. V1 and V2 are equal and are set by cascode circuits Q11 and Q12 at the outputs of the current sources $I_2$ and $I_3$. C2 is therefore charged up to V2−0.8 V.

Now, when the input changes so that $V_{IN}$ becomes more negative than $-V_{IN}$, C2 will need to discharge rapidly to a voltage equal to V1−($I_1$R2)−0.8 V. This is accomplished when Q1 turns off and $I_6$ becomes equal to $I_2$, which is equal to $I_1$+ΔI. Now, $I_5$ will equal $NI_6$ or N($I_1$+ΔI), which will pull current from C2, thereby allowing it to reach its final state voltage more rapidly.

Thus, the current $I_5$ can be set with a small current, NΔI, to keep Q14 and Q18 on, but at a low current level. To maximize the circuit's switching speed, $I_5$ is then increased to N($I_1$+ΔI) to rapidly discharge C2 when it is switched to the low state. Since the circuit is symmetrical, the other half works in the same manner.

The novel circuit 40 of the present invention therefore reduces power in an output driver by dynamically controlling the current sinks, turning them on or off (or reduced in magnitude) through the use of current mirrors controlled by the input signal. When a current source or sink is not needed, it is much reduced and therefore dissipating little power. The sink currents are controlled by much smaller currents due to the ability of a current mirror to scale (have current gain) the value of the mirrored currents. In this way, overall power consumption can be reduced over prior art implementations.

Depending on the value of N, there is a power reduction from the prior art of 14% for N=5 to almost 30% when N=50. While the prior art circuit as shown in FIG. 2 has six fixed current sources, the driver 40 of the present invention has two fixed current sources, $I_2$ and $I_3$ (since $I_1$ will sink whichever one passes through the input Darlington pair and therefore does not dissipate any additional power), and two dynamic current sources that are in fact current mirrors (56 and 58). The collector currents for Q19 and Q16 are not considered in the calculations since they are the base currents of (Q18, Q20) and (Q15, Q17), respectively, and are very small compared to the other current sources (sinks). The current mirrors can be optimized to provide gain so that the controlling currents need not be large. Significant power reductions are realized for values of N greater than 5.

Figure 4:
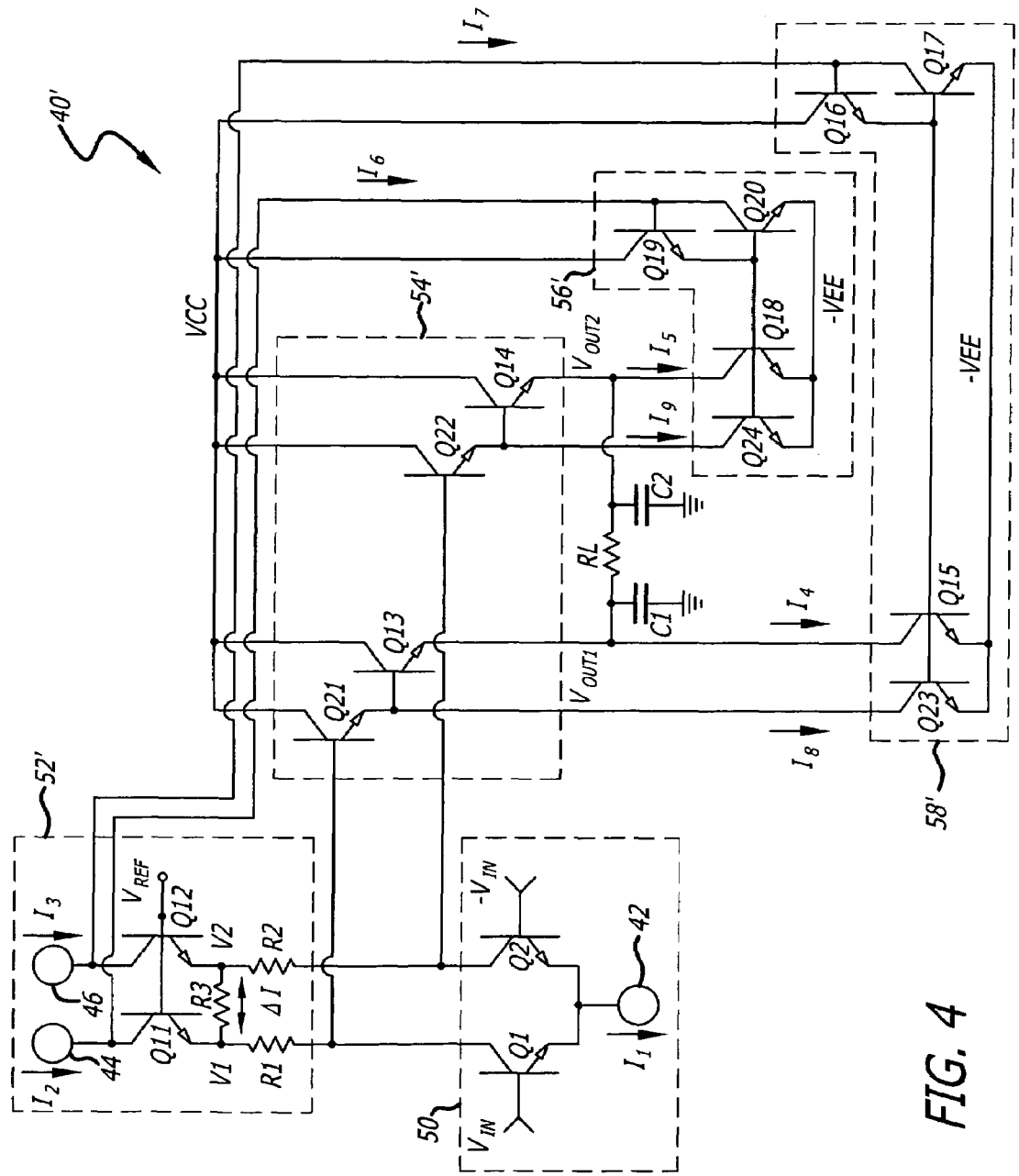
FIG. 4 is a simplified schematic of an alternate embodiment of an output driver designed in accordance with the teachings of the present invention.

FIG. 4 is a simplified schematic of an alternate embodiment of an output driver 40' designed in accordance with the teachings of the present invention. The circuit 40' is similar to circuit 40 of FIG. 3, except the output circuit 54' is modified to include Darlington pairs (Q21, Q13) and (Q22, Q14) to improve circuit drive and speed. The collector of Q1 is now coupled to the base of Q21, the emitter of which is connected to the base of Q13. The emitter of Q13 is coupled to $V_{OUT1}$. The collectors of Q21 and Q13 are coupled to $V_{CC}$. The collector of Q2 is now coupled to the base of Q22, the emitter of which is connected to the base of Q14. The emitter of Q14 is coupled to $V_{OUT2}$. The collectors of Q22 and Q14 are coupled to $V_{CC}$.

An additional output can also be added to each current mirror 56' and 58' to drive the transistors Q22 and Q21, respectively. In the illustrative embodiment, current mirror 56' further includes a transistor Q24 having a base coupled to the emitter of Q19, an emitter coupled to $-V_{EE}$, and a collector coupled to the emitter of Q22. Current mirror 58' further includes a transistor Q23 having a base coupled to the emitter of Q16, an emitter coupled to $-V_{EE}$, and a collector coupled to the emitter of Q21. These additional outputs Q23 and Q24 are tailored to have a gain K in order to optimize the circuit's performance in both power and speed. Optimum values for K and N are selected depending on the particular technology used and current drive requirements.

The embodiment of FIG. 4 shows yet another improvement. A resistor R3 is added to the current controlling circuit 52' between the emitters of Q11 and Q12. This allows a trickle current (ΔI) to flow through R3, the direction of the trickle current being determined by whichever transistor (Q1 or Q2) is more on at the time (i.e. which base to emitter voltage $V_{BE}$ is larger). This trickle current keeps the cascode transistors Q11 and Q12 always 'on' and therefore improves the switching speed of the circuit. For this example, let $I_2$ and $I_3$ both equal $I_1$. When Q1 is on and Q2 is off, $I_6$=ΔI. Therefore $I_5$=$NI_6$ or $I_5$=NΔI. $I_7$ is now equal to $I_3$−ΔI. The rest of the circuit operates as described previously assuming the additional base to emitter voltage drop in the Darlington pair is properly considered.

Thus, the present invention has been described herein with reference to a particular embodiment for a particular application. Those having ordinary skill in the art and access to the present teachings will recognize additional modifications, applications and embodiments within the scope thereof. For example, while the illustrative embodiments have been described using NPN bipolar transistors, other process technologies may be used without departing from the scope of the present teachings.

It is therefore intended by the appended claims to cover any and all such applications, modifications and embodiments within the scope of the present invention.

Accordingly,

What is claimed is:

1. An output driver comprising:
   first means for receiving an input signal and in accordance therewith generating an output signal at a first output node;
   second means for applying a variable current to said first output node; and
   third means for controlling the magnitude of said variable current in accordance with said output signal;
   wherein said third means includes a first circuit adapted to generate a first controlling current in accordance with said output signal, and
   wherein said second means includes a first current mirror adapted to receive said first controlling current and output a scaled version of said first controlling current to said first output node.

2. The invention of claim 1 wherein said output driver is implemented differentially.

3. The invention of claim 2 wherein said first means includes an input circuit adapted to receive a first input signal and a second input signal and in accordance therewith output first and second output signals.

4. The invention of claim 3 wherein said input circuit includes a differential pair comprising transistors Q1 and Q2 adapted to receive said first and second input signals, respectively, and output said first and second output signals, respectively.

5. The invention of claim 4 wherein said differential pair is biased by a first current source $I_1$.

6. The invention of claim 5 wherein said first means further includes an output circuit adapted to receive said first and second output signals from said input circuit and in accordance therewith generate third and fourth output signals at said first output node and a second output node, respectively.

7. The invention of claim 6 wherein said first circuit is adapted to receive said first and second output signals from said input circuit and in accordance therewith generate first and second controlling currents.

8. The invention of claim 7 wherein said second means further includes a second current mirror adapted to receive said second controlling current and output a scaled version of said second controlling current to said second output node.

9. The invention of claim 8 wherein said first controlling current is relatively large and said second controlling current is relatively small when said first input signal is more negative than said second input signal.

10. The invention of claim 9 wherein said first controlling current is relatively small and said second controlling current is relatively large when said first input signal is more positive than said second input signal.

11. The invention of claim 7 wherein said first circuit includes cascode transistors Q11 and Q12 coupled to said first and second output signals from said input circuit.

12. The invention of claim 11 wherein said cascode transistors Q11 and Q12 are biased by a second current source $I_2$ and a third current source $I_3$, respectively.

13. The invention of claim 12 wherein said current source $I_2$ is slightly larger than $I_1$.

14. The invention of claim 13 wherein said current source $I_3$ is slightly larger than $I_1$.

15. The invention of claim 12 wherein the emitter of Q11 is connected to the collector of Q1 through a resistor R1, and the emitter of Q12 is connected to the collector of Q2 through a resistor R2.

16. The invention of claim 15 wherein the collector of Q11 is coupled to said current source $I_2$ and the collector of Q12 is coupled to said current source $I_3$.

17. The invention of claim 16 wherein the collector of Q11 is also coupled to an input of said second current mirror, thereby supplying said second controlling current to said second current mirror.

18. The invention of claim 17 wherein the collector of Q12 is also coupled to an input of said first current mirror, thereby supplying said first controlling current to said first current mirror.

19. The invention of claim 12 wherein said first circuit further includes fourth means for providing a trickle current between said transistors Q11 and Q12.

20. The invention of claim 19 wherein said fourth means includes a resistor connected between the emitters of Q11 and Q12.

21. The invention of claim 20 wherein said current sources $I_2$ and $I_3$ both equal $I_1$.

22. The invention of claim 6 wherein said output circuit includes a transistor Q13 adapted to receive said first output signal and in accordance therewith generate said third output signal at said first output node.

23. The invention of claim 6 wherein said output circuit includes a transistor Q14 adapted to receive said second output signal and in accordance therewith generate said fourth output signal at said second output node.

24. The invention of claim 6 wherein said output circuit includes a first Darlington pair adapted to receive said first output signal and in accordance therewith generate said third output signal at said first output node.

25. The invention of claim 6 wherein said output circuit includes a second Darlington pair adapted to receive said second output signal and generate said fourth output signal at said second output node.

26. The invention of claim 24 wherein said first current mirror is further adapted to generate a second scaled version of said first controlling current for biasing said first Darlington pair.

27. The invention of claim 25 wherein said second current mirror is further adapted to generate a second scaled version of said second controlling current for biasing said second Darlington pair.

28. An output driver comprising:
a first circuit for receiving an input signal and in accordance therewith generating an output signal at an output node;
a second circuit for generating a variable current in accordance with said output signal; and
a current mirror for generating a scaled version of said variable current and applying said scaled current to said output node.

29. A differential output driver comprising:
an input circuit for receiving first and second input signals and in accordance therewith generating first and second output signals;
an output circuit adapted to receive said first and second output signals and in accordance therewith generate third and fourth output signals at a first output node and a second output node, respectively;
a circuit adapted to receive said first and second output signals from said input circuit and in accordance therewith generate first and second controlling currents;
a first current mirror adapted to receive said first controlling current and apply a scaled version of said first controlling current to said first output node; and
a second current mirror adapted to receive said second controlling current and apply a scaled version of said second controlling current to said second output node.

\* \* \* \* \*